United States Patent [19]
Harris et al.

[11] Patent Number: 6,127,695
[45] Date of Patent: Oct. 3, 2000

[54] LATERAL FIELD EFFECT TRANSISTOR OF SIC, A METHOD FOR PRODUCTION THEREOF AND A USE OF SUCH A TRANSISTOR

[75] Inventors: Christopher Harris, Sollentuna; Andrei Konstantinov, Järfälla, both of Sweden

[73] Assignee: Acreo AB, Kista, Sweden

[21] Appl. No.: 09/247,469

[22] Filed: Feb. 8, 1999

[51] Int. Cl.[7] .................. H01L 31/0312; H01L 21/335
[52] U.S. Cl. .................. 257/77; 257/343; 438/270; 438/931
[58] Field of Search .................. 257/77, 347, 343, 257/336, 492, 626, 200, 632, 635, 289; 438/197, 270, 268, 931, 198

[56] References Cited

U.S. PATENT DOCUMENTS

| | | | |
|---|---|---|---|
| 5,270,554 | 12/1993 | Palmour | 257/77 |
| 5,569,937 | 10/1996 | Bhatnagar et al. | 257/77 |
| 5,627,385 | 5/1997 | Bhatnagar et al. | 257/77 |
| 5,629,531 | 5/1997 | Palmour | 257/77 |
| 5,686,737 | 11/1997 | Allen | 257/77 |
| 5,734,180 | 3/1998 | Malhi | 257/77 |
| 5,780,878 | 7/1998 | Bhatnagor et al. | 257/77 |
| 5,859,939 | 4/1999 | Ueno | 257/279 |
| 5,909,039 | 6/1999 | Bakowski et al. | 257/77 |
| 5,915,180 | 6/1999 | Hara et al. | 438/270 |
| 5,925,895 | 7/1999 | Sriram et al. | 257/77 |

FOREIGN PATENT DOCUMENTS

| | | | |
|---|---|---|---|
| 0620599 | 10/1994 | European Pat. Off. | 257/77 |
| WO97/36313 | 10/1997 | WIPO | 257/77 |
| WO99/45594 | 9/1999 | WIPO | 257/77 |

OTHER PUBLICATIONS

Weitzel, "Silicon Carbide High Frequency Devices", Materials Science Forum vols. 264–268 (1998), pp. 907–912.

Sadler, et al. "SiC MESFET with Output Power of 50 Watts CW at S–Band", Proc. 1998 Device Research Conference, IEEE 1998, pp. 92–93.

Nordell, et al. "Growth of 4H and 6H SiC in Trenches and Around Stripe Mesas", Materials Science Forum vols. 264–268 (1998), pp. 131–134.

Primary Examiner—Donald L. Monin, Jr.
Attorney, Agent, or Firm—Dilworth & Barrese

[57] ABSTRACT

A lateral field effect transistor of SiC for high switching frequencies comprises a source region layer (5) and a drain region layer (6) laterally spaced and highly doped n-type, an n-type channel layer (4) extending laterally and interconnecting the source region layer and the drain region layer for conducting a current between these layers in the on-state of the transistor, and a gate electrode (9) arranged to control the channel layer to be conducting or blocking through varying the potential applied to the gate electrode. A highly doped p-type base layer (12) is arranged next to the channel layer at least partially overlapping the gate electrode and being at a lateral distance to the drain region layer. The base layer is shorted to the source region layer.

30 Claims, 3 Drawing Sheets

LATERAL FIELD EFFECT TRANSISTOR OF SIC, A METHOD FOR PRODUCTION THEREOF AND A USE OF SUCH A TRANSISTOR

BACKGROUND OF THE INVENTION

The present invention relates to a lateral field effect transistor of SiC for high switching frequencies comprising a source region layer and a drain region layer laterally spaced and highly doped n-type, an n-type channel layer of lower doping concentration extending laterally and interconnecting the source region layer and the drain region layer for conducting a current between these layers in the on-state of the transistor, and a gate electrode arranged to control the properties of the channel layer to be conducting or blocking through varying the potential applied to the gate electrode.

"High switching frequencies" means here frequencies above 1 MHz. Such transistors may be used in for instance power microwave applications in for example base stations for mobile telephones, radars and microwave ovens.

High frequency field effect transistors of this type require short gate electrodes in order to increase on-state channel current, minimize the carrier transit time in the channel and. the gate capacitance. Shorter gate electrodes will therefore result in higher power and higher operation frequency. On the other hand, undesirable short-channel effects become significant as the gate length is decreased. Transistors with very short gates often do not show saturation in drain current with increasing drain bias, and a continual increase in drain current with increasing the drain bias is observed instead. This occurs because of the channel length modulation by the drain bias. Furthermore, in the extreme case a parasitic bipolar transistor can be turned on at a high drain bias, in which the source and drain act as the collector and emitter of the parasitic transistor, and the layer next to the channel layer, which is a substrate or buffer layer, is then the base. This effect may not be particularly significant for low power high frequency transistors, but it increasingly dominates the performance of high power transistors, in which the drain bias should be as high as possible in order to increase the total power.

Silicon carbide has, as a material for high frequency power transistor applications a number of advantages with respect to for instance Si. It has a high breakdown field, which results in a possibility to have shorter carrier transit times, a high saturation drift velocity and a high thermal conductivity.

A transistor of the type defined in the introduction is known through for instance U.S. Pat. No. 5,270,554, which describes a high frequency field effect transistor with a lateral n-type channel. A channel of n-type conductivity is preferred, because the mobility of free electrons is considerably higher than valence-band holes in SiC. This transistor already known has a conductive substrate, a p-type buffer layer on top thereof, an n-type channel layer and highly doped contact regions formed in order to decrease the resistance of the drain and source region layers, as well as to minimise the contact resistance of these layers. The buffer layer of this transistor has to be low-doped and thick in order to block high voltages, minimise high-frequency active losses due to conductance and minimise reactive losses due to internal capacitances. This type of design is particularly prone to short-channel effects and a parasitic bipolar transistor turns on at large drain bias, said buffer layer functioning as the base of such a bipolar transistor. Such effects may be suppressed by increasing the gate length, but that would deteriorate the on-state current and high-frequency performance.

Accordingly, lateral field effect transistors of SiC for high switching frequencies experience undesirable short-channel effects if a short gate electrode is formed. The values of gate length, which can be achieved using currently available pattern definition tools are coniderably below those, which are required for blocking a high voltage, which means that such high frequency transistors do not utilise the material potential to the full extent.

SUMMARY OF THE INVENTION

The object of the present invention is to provide a lateral field effect transistor of the type defined in the introduction, which has an increased operation speed and may be operated at a higher power than such transistors already known.

This object is according to the invention obtained by providing such a transistor with a highly doped p-type base layer arranged next to the channel layer at least partially overlapping the gate electrode and at a lateral distance to the drain region layer, said base layer being shorted to the source region layer.

Such a highly doped p-type base layer will first of all block the extension of the depleting region from the source region layer to the drain region layer. In a structure like this the electric field will be entirely blocked by the base layer, so that a parasitic bipolar transistor can not be formed, even if the lateral length of the gate is very small. Furthermore, the p-n-junction so created can block higher voltages than a Schottky barrier, resulting in an increase of the possible power. The reason for having the base layer restricted to not extend to the drain region layer is that this will keep the drain-to-gate capacitance low.

According to a preferred embodiment of the invention the doping concentration of said base layer decreases either gradually or step-wise over at least a part of the lateral extension thereof in the lateral direction from the source region layer towards the drain region layer. Although a high doping concentration of the p-base layer is preferable from the viewpoint of reliable electrical grounding to the source region layer, the considerations of obtaining a high avalanche breakdown voltage for the junction between the base layer and the channel layer may impose a different requirement. A sharp curvature or an edge of a highly doped region will result in an electric field concentration and decrease the breakdown voltage. The decrease according to this embodiment will result in a highly doped region of the base layer providing sufficient conductance to lead the AC current to the source, whereas the portion with a lower doping will make possible an increase in the breakdown voltage.

According to another preferred embodiment of the invention the doping concentration of said base layer is above $10^{18}$ cm$^{-3}$, more preferred above $10^{19}$ cm$^{-3}$ and most preferred above $10^{20}$ cm$^{-3}$. It has been realised that it is preferable to form the base layer as highly doped as possible for the following reasons: a high-frequency electric field may penetrate into a bulk conductive material for frequencies above the dielectric relaxation frequency. If this field penetration indeed occurs in a transistor structure of this type the base layer can no longer block the high frequency electric field, and it will therefore not function properly. Said dielectric relaxation frequency is proportional to the conductivity of the material. Secondly, high frequency losses due to conduction will detonate the transistor performance. For a particular transistor structure said penetration can potentially occur at frequencies, which are a few orders of magnitude lower than the dielectric relaxation frequency depending on device configuration. Accordingly, it is preferable to form the base layer as highly doped as possible, up to the solubility limit, which for for example aluminium in SiC is in the range $10^{20}$–$10^{21}$ cm$^{-3}$. Such a high doping provides better grounding of the high-frequency voltage induced at the base layer, and the ohmic contact resistance of the base layer will also be improved thereby. On the other hand, lower doping levels may be more convenient from viewpoint of manufacturing process, so that a compromise solution will be used.

According to another preferred embodiment of the invention said base layer is doped with Al. It has been realised that aluminium is a preferred dopant type, because aluminium acceptors have a lower thermal activation energy than for instance boron and therefore a higher conductivity can be obtained for aluminium-doped layers.

According to another preferred embodiment of the invention the transistor comprises an insulation layer arranged between the gate electrode and the channel layer. Such a MOS- or MIS-field effect transistor may have better high temperature capabilities than a transistor in which the gate electrode is arranged next to the channel layer, so-called metal-semiconductor FETs (MESFETs), and can be advantageously used for high temperature electronic applications.

According to another preferred embodiment of the invention at least a part of the source region layer is arranged next to the base layer for forming a pn-junction therebetween. Such an immediate contact of the highly doped n-type source region layer and the highly doped p-type base layer is advantageous, since the pn-junction so formed has a high capacitance which provides an efficient sink of the high frequency signal to the source.

According to another preferred embodiment of the invention the source region layer extends laterally under the channel layer substantially to the gate electrode, which will improve the on-state performance of the transistor.

According to another preferred embodiment of the invention the transistor comprises a trench, and the base layer and the source region layer are arranged on top of each other as seen in the lateral direction on a substantially vertical wall of the trench, which makes it possible to form a pn-junction with a high capacitance and short the AC component of the voltage induced at the base layer to the source and at the same time arrange the gate electrode with no lateral distance to the source region layer.

According to another preferred embodiment of the invention the transistor comprises a vertical trench having the source region layer formed on the substantially vertical walls thereof, and the orientation of the vertical walls are chosen to substantially align with the crystal planes of the SiC. This is preferable for the following reason. A transistor of this type is preferably obtained by using lateral epitaxial growth, which involves material-specific issues related to silicon carbide crystal symmetry. The growth rate and crystal habit for lateral epitaxy will depend on the orientation of the crystal planes forming said trench walls. It is therefore preferable to form the trenches for lateral epitaxy as straight lines of specific orientation rather than of circular or a polygonal configuration. Furthermore, a preferred configuration of a high power high frequency transistor is a linear array of source, drain, channel and gate regions. Interconnection of either sources or drains or gates is performed using air bridging or through hole technology in order to minimise resistance and inductance associated with the metal contacts. For a linear array an n-type source region layer has to be used as source region layer for two channels simultaneously. It is therefore preferable that the crystal planes forming the opposite sides of the trenches for lateral epitaxy are crystallographically symmetrical.

The invention also comprises a method for producing a lateral field effect transistor of SiC for high switching frequencies comprising the steps defined in the independent claim 18. Such a method enables the production of a lateral field effect transistor with the preferred features discussed above in a comparatively simple way and accordingly to a cost making the production thereof commercially interesting.

Furthermore, the invention also relates to another method for producing a lateral field effect transistor of SiC for high switching frequencies according to the independent claim 19. One advantage of a field effect transistor design employing such a lateral epitaxial growth technique is, as already mentioned, the possibility to minimise the source resistance by positioning the gate very close to or even overlapping the edge of the source region layer.

The invention also relates to a use of a transistor according to the invention for switching high frequencies above 1 MHz, preferably above 1 GHz, and in which it switches high frequency signals with a power above 1 W. A lateral field effect transistor of SiC according to the invention is well suited for switching such high frequencies in combination with high powers, since the arrangement of the base layer according to the invention makes it possible to benefit from the excellent properties of SiC with respect to high breakdown voltage and high thermal conductivity when making the gate electrode short, Preferred uses of a transistor according to the invention are furthermore in base stations for mobile telephones, in radars, in microwave ovens and in generating gas plasmas.

Further advantages and advantageous features of the invention appear from the following description and the other dependent claims.

BRIEF DESCRIPTION OF THE DRAWINGS

With reference to the appended drawings, below follows a specific description of preferred embodiments of the invention cited as examples.

In the drawings.

BRIEF DESCRIPTION OF A TRANSISTOR ACCORDING TO THE PRIOR ART

Figure 1:
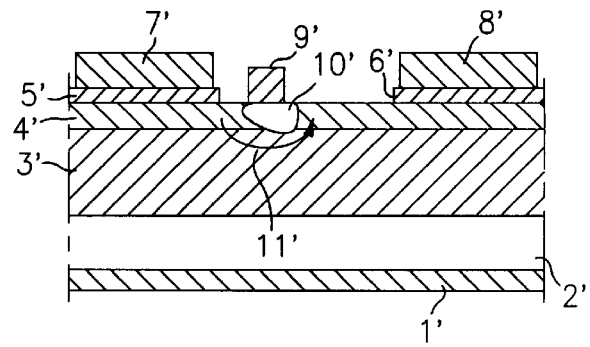
FIG. 1 is a schematic cross-section view of a lateral field effect transistor of SiC according to the prior art.

The transistor shown in FIG. 1 belongs to the prior art and has the following layers of SiC on top of a back side metalization layer 1': a semi-insulating substrate layer 2', a p-type buffer layer 3' and an n-type channel layer 4'. The buffer layer is present to minimize the effect of the deep centers present in the semi-insulating substrate on carrier transport. The doping level of the buffer layer should be low to keep high frequency losses at a low level. The transistor further comprises a source region layer 5' and a drain region layer 6' laterally spaced and highly doped n-type and arranged on top of the channel layer 4'. A source contact 7' and a drain contact 8' are arranged on these layers. The transistor also comprises a gate electrode 9' arranged on top of the channel layer 4' between the source region layer 5' and the drain region layer 6'. When a voltage is applied between the source contact and the drain contact a current may flow in the channel layer 4' between these two contacts as controlled by the gate electrode 9', The gate electrode 9' will control said current by the potential applied thereon. Upon applying a positive potential of a certain magnitude a depletion region 10' will form in the channel layer extending to the buffer layer 3', which means that the current flow will be blocked and the switch will be open or in the off-state. When no voltage forming such a depletion region is applied to the gate electrode the channel will be continuous and current will flow between the two contacts 7' and 8' and the transistor will be closed or in the on-state. The transistor is able to be switched with a high frequency through changing the potential of the gate electrode 9'. As already discussed in detail above, it is desirable to make the gate electrode 9' short as seen in the lateral direction, with however the result that in the extreme case a parasitic bipolar transistor can be turned on at a high drain bias, in which the source region layer 5' act as the collector and the drain region layer 6' act as the emitter of the transistor, while the buffer layer 3' forms the base 3'. When such a parasitic bipolar transistor is created the lateral field effect transistor can no longer be turned off by the gate electrode 9', and the transistor will accordingly fail to function properly. It is illustrated by the dashed line 11' how such a parasitic bipolar transistor may be turned on. In the practice, this means that the gate electrode of such a prior art transistor will be made with a larger lateral extension than desired so as to avoid such a failure, but this will then lead to longer carrier transit time of the channel, a higher gate capacitance and a higher on-state resistance leading to increased losses.

DETAILED DESCRIPTION OF PREFERRED EMBODIMENTS OF THE INVENTION

A transistor according to a first preferred embodiment of the invention and the principles of the invention itself will now be described with reference to FIG. 2. The same reference numerals as those used for the prior art transistor in FIG. 1 will be used hereafter for the transistors according to the different embodiments of the invention. The main difference between the transistor according to FIG. 2 and the prior art transistor according to FIG. 1 is that a highly doped p-type base layer 12 is arranged next to the channel layer 4 overlapping the gate electrode 9 and at a lateral distance to the drain region layer 6. The base layer is shorted to the source region layer 5 by the metal source contact 7.

The base layer 12 is preferably doped up to the solubility limit for the reasons mentioned above, and this is for aluminium as dopant in SiC in the range $10^{20}$–$10^{21}$ cm$^{-3}$. However should lower doping levels be more convenient from the viewpoint of the manufacturing process used, the doping concentration should in any case be above $10^{18}$ cm$^{-3}$ and more preferably above $10^{19}$ cm$^{-3}$.

Figure 2:
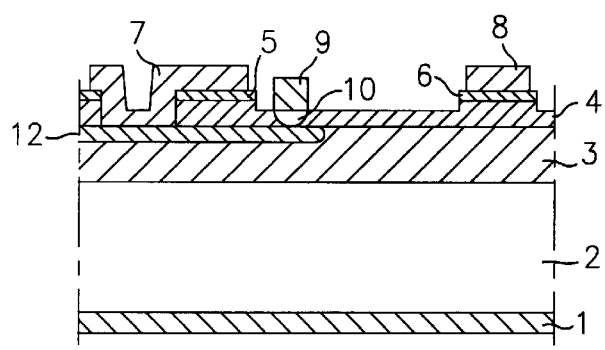
FIG. 2 is a schematic cross-section view of a lateral field effect transistor according to a first preferred embodiment of the invention.

The transistor shown in FIG. 2 may be provided with a gate electrode 9 having a very short length, quite possibly as short as 0.2–0.3 μm, without any risk of a formation of a parasitic bipolar transistor as described above. This is due to the fact that the electric field between the source and the drain will in the off-state of the transistor be entirely blocked by the highly doped base layer, so that the parasitic bipolar transistor can not be formed, even if the active gate length is very small. The high p-type doping of the base layer is required first of all because it should block the extension of the depletion region from the source to the drain. The lateral extension of the base layer is confined so that it will not extend underneath the drain region layer 6, which is required in order to keep a low drain-to-gate capacitance. Moreover, it is only necessary that the base layer 12 partially overlap the gate electrode.

It is preferred that the doping concentration of the base layer 12 decreases either gradually or step-wise in the lateral direction from the source region layer towards the drain region layer for the reasons mentioned further above. Furthermore, aluminium is a preferred dopant type for the base layer, since aluminium acceptors have a low thermal activation energy in SiC, so that a high conductivity can be obtained.

Figure 3:
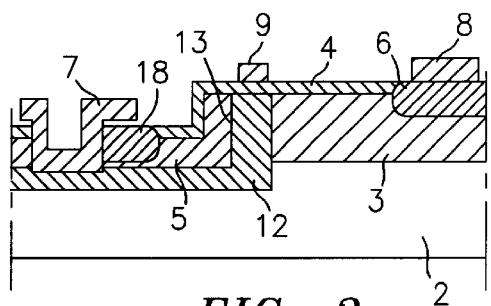
FIG. 3 is a schematic cross-section view of a lateral field effect transistor according to a second preferred embodiment of the invention.

A transistor according to a second preferred embodiment of the invention is illustrated in FIG. 3, and this is formed partially by lateral epitaxy as will be described further below. This embodiment differs from that shown in FIG. 2 primarily by the fact that the base layer 12 and the source region layer 5 are arranged in immediate contact with each other and that the gate electrode 9 is arranged very close to the source region layer. The pn-junction 13 formed between the base layer and the source region layer has a high capacitance, which provides an efficient sink of the high frequency signal to the source. An ohmic contact 7 to the base layer must in this case only provide sink of the DC component of the current flowing through the base layer. The DC component of the base layer current is very small because the pn-junction between the base layer and the channel layer is reverse biased under normal operation conditions. The ohmic contact shorting the base layer to the source region layer may be positioned at a large distance from the channel without any deterioration of device performance. In certain cases no special shorting contact is required at all to short the DC base layer current component to the source region layer, and if the substrate and the buffer layer are conductive the DC component is shorted to the source through the buffer layer, and the patent claim definition "said base layer being shorted to the source region layer" should be interpreted to also cover this case. It is an additional advantage to form either the base layer or the source region layer degenerately doped so as to form a tunnel diode, i.e. a diode with tunneling properties, at their interface resulting in a tunnel current and a high junction capacitance automatically shorting the base layer to the source region layer.

Figure 4:
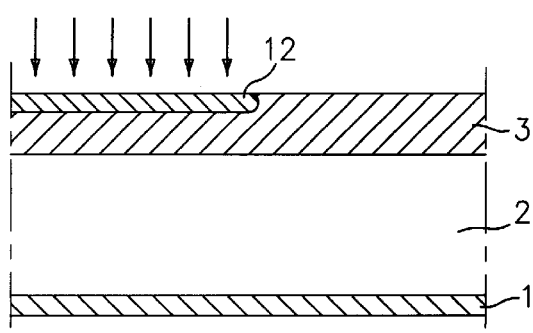
FIG. 4 is a cross-section view illustrating the step of producing the base layer in the transistor according to FIG. 2.
Figure 5:
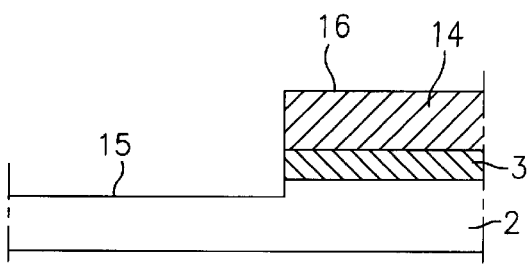
FIGS. 5–9 are schematic cross-section views illustrating different steps of a method according to the invention for producing the transistor shown in FIG. 3.
Figure 6:
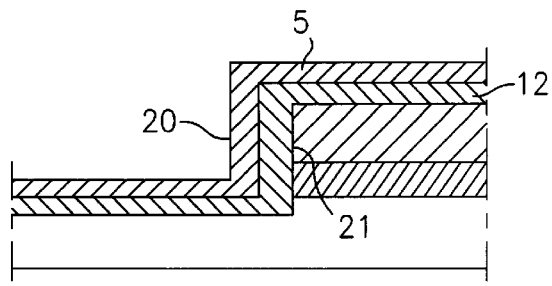

The positioning of the gate electrode 9 very close to the edge of the source region layer 5 minimizes the source resistance and will improve the on-state performance of the transistor. How the transistors according to FIGS. 2 and 3 may be produced will now be described. The transistor according to FIG. 2 will be produced by starting to grow a low-doped ($3 \times 10^{15}$ cm$^{-3}$), 0.75 μm thick p-type buffer layer 3 on top of a semi-insulating substrate layer 2, preferably by using Chemical Vapor Deposition (CVD). A suitable mask not shown in FIG. 4 is then applied on the buffer layer and an aperture is patterned in the mask, whereupon Al ions are implanted through said aperture for forming a highly doped p-type base layer 12 of a box-type profile with a depth of 0.4

μm as schematically illustrated in FIG. 4. The doping level of the base layer will be $3 \times 10^{19}$ cm$^{-3}$. For this Al ions are implanted with for example energies of 40, 100, 170 and 300 keV and doses of $1,3 \times 10^{14}$ cm$^{-2}$, $2,1 \times 10^{14}$ cm$^{-2}$, $2,7 \times 10^{14}$ cm$^{-2}$ and $6,7 \times 10^{14}$ cm$^{-2}$, respectively. Then the mask is removed and the Al ions are activated by annealing at an anneal temperature not less than 1700° C. After that an n-type channel layer is epitaxially grown on top of the base layer and the buffer layer. The thickness of this layer will be approximately 0.3 μm and it will be doped with nitrogen to a concentration of $5 \times 10^{17}$ cm$^{-3}$. A source region layer and a drain region layer of a thickness of 0.15 μm and a concentration of nitrogen of $1 \times 10^{19}$ cm$^{-3}$ are epitaxially grown on top of the channel region layer at laterally spaced positions with the drain region layer laterally spaced with respect to the base layer. This is in practice obtained by growing one layer on top of the channel region layer and then depositing a mask thereon and patterning the mask so that the source region layer and the drain region layer are defined. A gate electrode 9 is then applied on top of the channel layer at least partially overlapping the base layer, and the source metal contact 7 and the drain metal contact 8 are applied on the source region layer and the drain region layer, respectively, in which the former is applied so that it shorts the base layer to the source region layer. These are the most important steps of the method for producing the lateral field effect transistor according to FIG. 2, but the method also includes further conventional steps obvious to a man with ordinary skill in the art. Values of doping concentration and feature size are given as an illustration only, exact figures result from a more detailed specification of power and frequency response required.

Figure 7:
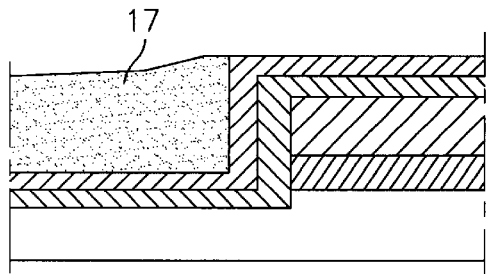
Figure 8:
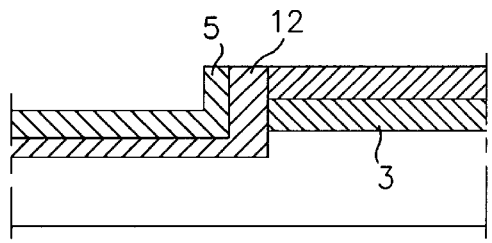
Figure 9:
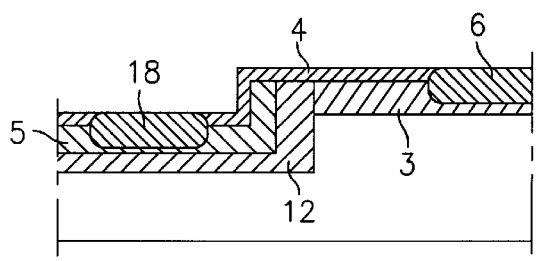

It will now with reference to FIGS. 5–9 be briefly described how a transistor according to the preferred embodiment shown in FIG. 3 may be produced according to a preferred method. The method is started by epitaxially growing by CVD on top of a substrate layer 2, a p-type buffer layer 3 and an n-type layer 14. A mesa etch is then carried out through the two layers epitaxially grown for forming a step or trench 20 (see FIG. 5) with a lower first portion 15 with the substrate exposed and an upper second portion 16 with said n-type layer 14 on top. A highly doped p-type base layer 12 and a highly doped n-type source region layer 5 are after that epitaxially grown on top of the etched mesa structure (see FIG. 6). A protective layer 17 of for instance SiO$_2$ is then deposited on the lower first portion of the mesa structure at least to the level of the upper, second portion as illustrated in FIG. 7. The two upper layers highly doped of n-type and p-type are then etched away from said upper, second portion while leaving them on a mesa wall 21 (trench wall) connecting the two portions and on the lower, first portion as illustrated in FIG. 8. The protective layer is then removed and an n-type channel layer 4 is epitaxially grown on top of the mesa structure. After applying a mask and appropriate patterning a highly doped n-type drain region layer is formed by ion implantation in said second portion at a lateral distance to the base layer and to the source region layer. n-type dopants are also implanted through the channel layer 4 into the source region layer 5 for creating a highly doped n-type layer 18 providing a low resistance contact between the source region layer and the source contact. Finally, a gate electrode is applied on top of the channel layer as shown in FIG. 3 and a source contact and a drain contact on top of the source region layer and the drain region layer as shown in FIG. 3.

Figure 10:
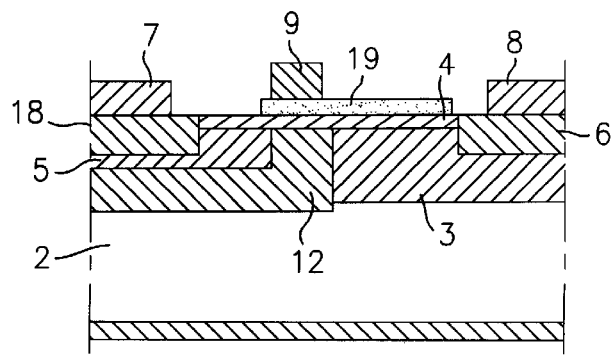
FIG. 10 is a schematic cross-section view of a lateral field effect transistor according to a third preferred embodiment of the invention.
Figure 11:
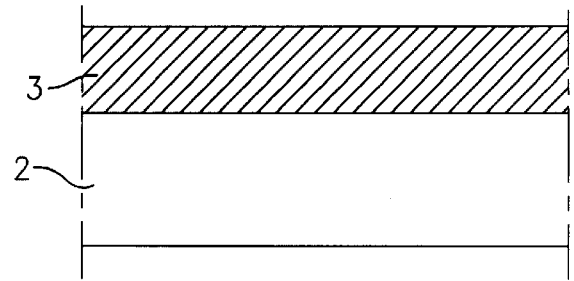
FIGS. 11–15 are schematic cross-section views illustrating different steps of a method for producing the transistor according to FIG. 10.
Figure 12:
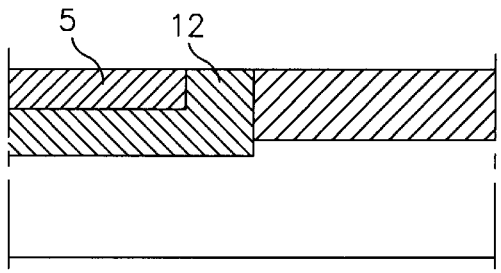

A transistor according to a third preferred embodiment of the invention is schematically illustrated in FIG. 10, and this differs mainly from those already described by the fact that the gate electrode 9 is separated from the channel layer by an insulation layer 19, for instance of SiO$_2$, AlN, silicon nitride, aluminium oxide or combinations thereof. A transistor with such a MIS structure can have better high temperature capabilities than metal-semiconductor field effect transistors as shown in FIGS. 2 and 3 and can be used for high temperature electronic applications.

Figure 13:
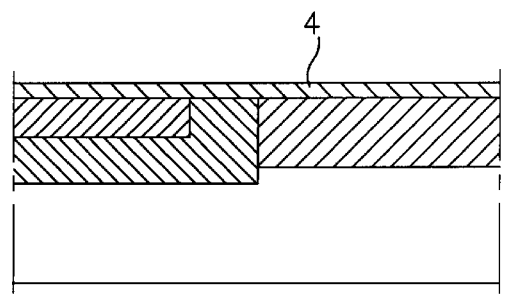
Figure 14:
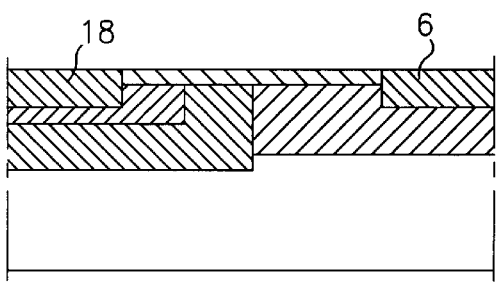
Figure 15:
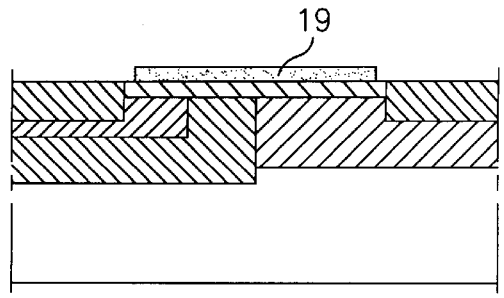

The transistor according to FIG. 10 may be fabricated through the sequence illustrated in FIGS. 11–15 starting by growing a low-doped p-type buffer layer 3 onto a semi-insulating substrate 2. A p-base layer 12 and a source region layer 5 are then formed in the same way as for the embodiment of FIG. 3 using lateral epitaxy and planarisation. An n-type channel layer 4' is then epitaxially grown on top of the base layer and the source region layer as shown in FIG. 13. Highly doped source and drain contact regions 6, 18 are formed by implanting nitrogen to provide a concentration above $10^{18}$ cm$^{-3}$. Annealing then takes place at approximately 1700° C. The insulating layer is then deposited or grown on top of the structure and patterned to the appearance shown in FIG. 15. Finally, the final structure according to FIG. 10 is obtained by depositing the gate electrode, the source metal contact and the drain metal contact.

The invention is of course not in any way restricted to the preferred embodiments described above, but many possibilities to modifications thereof would be apparent to a man with ordinary skill in the art without departing from the basic idea of the invention as defined in the appended claims.

The extension of the highly doped base layer in the lateral direction with respect to the drain region layer and with respect to the gate electrode may be varied as long as the conditions of a lateral spacing between the drain region layer and the base layer as well as an at least partial overlap of the base layer and the gate electrode are observed.

Furthermore, it is emphasized that the mutual proportions of the different layers of the transistors as shown in the figures are only chosen for the sake of clearness and may in practice be totally different.

What is claimed is:

1. A lateral field effect transistor of SiC for high switching frequencies comprising a source region layer (5) and a drain region layer (6) laterally spaced and highly doped n-type, an n-type channel layer (4) of lower doping concentration extending laterally and interconnecting the source region layer and the drain region layer for conducting a current between these layers in the on-state of the transistor, and a gate electrode (9) arranged to control the properties of the channel layer to be conducting or blocking through varying the potential applied to the gate electrode, characterized in that it further comprises a highly doped p-type base layer (12) arranged next to the channel layer at least partially overlapping the gate electrode and being at a lateral distance to the drain region layer, said base layer being shorted to the source region layer.

2. A transistor according to claim 1, characterized in that said base layer (12) is arranged at least partially under the channel layer (4).

3. A transistor according to claim 2, characterized in that the gate electrode (9) is arranged over at least a part of the channel layer (4).

4. A transistor according to claim 1, characterized in that the base layer (12) is totally overlapping the gate electrode (9).

5. A transistor according to claim 1, characterized in that the doping concentration of said base layer (12) decreases either gradually or step-wise over at least a part of the lateral extension thereof in the lateral direction from the source region layer (5) towards the drain region layer (6).

6. A transistor according to claim 1, characterized in that the doping concentration of said base layer (12) is above $10^{18}$ cm$^{-3}$, more preferred above $10^{19}$ cm$^{-3}$ and most preferred above $10^{20}$ cm$^{-3}$.

7. A transistor according to claim 1, characterized in that said base layer (12) is doped with Al.

8. A transistor according to claim 1, characterized in that it further comprises a p-type buffer layer (3) arranged so as to separate the channel layer (4) from the substrate.

9. A transistor according to claim 1, characterized in that the gate electrode (9) is arranged next to the channel layer (4).

10. A transistor according to claim 1, characterized in that it comprises an insulation layer (19) arranged between the gate electrode (9) and the channel layer (4).

11. A transistor according to claim 1, characterized in that at least a part of the source region layer (5) is arranged next to the base layer (12) for forming a pn-junction (13) therebetween.

12. A transistor according to claim 11, characterized in that the source-region layer (5) and the base layer (12) are arranged to form a substantially vertical pn-junction (13) therebetween.

13. A transistor according to claim 11, characterized in that it comprises a trench (20), and that the base layer (12) and the source region layer (5) are arranged on top of each other as seen in the lateral direction on a substantially vertical wall (21) of the trench.

14. A transistor according to claim 1, characterized in that the source region layer (5) extends laterally under the channel layer (4) substantially to the gate electrode (9).

15. A transistor according to claim 1, characterized in that it comprises a vertical trench (20) from above having the source region layer (5) applied at substantially vertical walls (21) thereof, and that the crystal planes of the SiC forming opposite, substantially vertical trench walls are substantially crystallographically symmetrical.

16. A transistor according to claim 1, characterized in that the lateral extension of the gate electrode (9) is below 1.5 μm, preferably below 0.4 μm.

17. A transistor according to claim 1, characterized in that it is constructed for switching frequencies above 1 MHz.

18. A use of a transistor according to claim 1 for switching high frequencies above 1 MHz.

19. A use of a transistor according to claim 18, for switching high frequency above 1 GHz.

20. A use of a transistor according to claim 1 for switching high frequency signals with a power above 1 W.

21. A use of a transistor according to claim 1 in base stations for mobile telephones.

22. A use of a transistor according to claim 1 in radars.

23. A use of a transistor according to claim 1 in microwave heating applications.

24. A use of a transistor according to claim 1 in generating gas plasmas.

25. A method comprising the steps of:
 1) epitaxially growing a doped buffer layer (3) of p-type on top of a substrate layer (2),
 2) applying a mask upon the buffer layer and patterning an aperture in the mask,
 3) implanting p-type dopants into a surface layer of the buffer layer under said aperture for forming a highly doped p-type base layer (12),
 4) removing the mask and annealing the implanted layer for making the dopants implanted electrically active,
 5) epitaxially growing an n-type channel layer (4) on top of the base layer and the buffer layer,
 6) epitaxially growing a source region layer (5) and a drain region layer (6) on top of the channel region layer at laterally spaced positions with the drain region layer at a lateral distance to the base layer, and shorting the base layer to the source region layer,
 7) applying a gate electrode (9) on top of the channel layer (4) at least partially overlapping the base layer (12) and a source contact (7) and a drain contact (8) on the source region layer and the drain region layer, respectively.

26. A method according to claim 25, characterized in that Al is used as dopants for said highly doped p-type base layer (12).

27. A method according to claim 25, characterized in that said highly doped p-type base layer (12) is produced while giving it a doping concentration above $10^{19}$ cm$^{-3}$.

28. A method comprising the steps of:
 1) epitaxially growing in the order mentioned on top of a substrate layer (2) a p-type buffer layer (3) and an n-type layer (14),
 2) carrying out a mesa etch through said two layers epitaxially grown for forming a step with a lower first portion (15) with the substrate exposed and an upper second portion (16) with said n-type layer on top,
 3) epitaxially growing in the order mentioned a highly doped p-type base layer (12) and a highly doped n-type source region (5) layer on top of the etched mesa structure,
 4) depositing a protective layer (17) on the lower first portion of the mesa structure at least to the level of the upper, second portion,
 5) etching the two upper layers highly doped of n-type and p-type away from said upper, second portion while leaving them, on a mesa wall connecting the two portions and on the lower, first portion,
 6) removing the protective layer and epitaxially growing an n-type channel layer (4) on top of the mesa structure,
 7) applying a highly doped n-type drain region layer (6) at said second portion at a lateral distance to said base layer (12) and to said source region layer (5),
 8) applying a gate electrode (9) on top of the channel layer (4) at least partially overlapping said base layer and a source contact (7) and a drain contact (8) on top of the source region layer and the drain region layer, respectively.

29. A method according to claim 28, characterized in that the drain region layer (6) is applied by implanting n-type dopants into a restricted area of said second portion (16).

30. A method according to claim 28, characterized in that a low resistance contact between the source region layer and the source contact is established by implanting n-type dopants at a high dose into said first portion for creating a highly doped n-type layer (18) extending through the channel layer and into the source region layer after step 6).

* * * * *